United States Patent
Nago et al.

(10) Patent No.: US 11,469,304 B2
(45) Date of Patent: Oct. 11, 2022

(54) SEMICONDUCTOR DEVICE, METHOD FOR MANUFACTURING SEMICONDUCTOR DEVICE, AND MANUFACTURING APPARATUS OF SEMICONDUCTOR DEVICE

(71) Applicant: KABUSHIKI KAISHA TOSHIBA, Tokyo (JP)

(72) Inventors: Hajime Nago, Yokohama (JP); Jumpei Tajima, Mitaka (JP); Toshiki Hikosaka, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 77 days.

(21) Appl. No.: 17/014,333

(22) Filed: Sep. 8, 2020

(65) Prior Publication Data
US 2021/0234008 A1     Jul. 29, 2021

(30) Foreign Application Priority Data
Jan. 27, 2020   (JP) .............................. JP2020-010742

(51) Int. Cl.
*H01L 29/20*       (2006.01)
*H01L 29/205*      (2006.01)
(Continued)

(52) U.S. Cl.
CPC ........ *H01L 29/2003* (2013.01); *C23C 16/303* (2013.01); *C23C 16/4405* (2013.01);
(Continued)

(58) Field of Classification Search
None
See application file for complete search history.

(56) References Cited

U.S. PATENT DOCUMENTS

2013/0015466 A1  1/2013 Miyoshi et al.
2016/0359032 A1  12/2016 Kotani et al.
(Continued)

FOREIGN PATENT DOCUMENTS

JP    2015-56483 A    3/2015
JP    5758880 B2      8/2015
(Continued)

OTHER PUBLICATIONS

Sun et al., "102-GHz AlInN/GaN HEMTs on Silicon With 2.5-W/mm Output Power at 10 GHz", IEEE Electron Device Letters, vol. 30, No. 8, Aug. 2009, 3 pages.
(Continued)

*Primary Examiner* — Jack S Chen
(74) *Attorney, Agent, or Firm* — Oblon, McClelland, Maier & Neustadt, L.L.P.

(57) ABSTRACT

According to one embodiment, a semiconductor device includes a first semiconductor layer including $Al_{x1}Ga_{1-x1}N$ ($0 \leq x1 < 1$), a second semiconductor layer including $Al_{x2}In_{1-x2}N$ ($0 < x2 < 1$ and $x1 < x2$), and an intermediate region provided between the first and second semiconductor layers. The intermediate region includes $Al_{x3}Ga_{1-x3}N$ ($0 < x3 \leq 1$ and $x2 < x3$). The second semiconductor layer includes first and second surfaces. The second surface is between the intermediate region and the first surface in a first direction. The first direction is from the first semiconductor layer toward the second semiconductor layer. The second semiconductor layer includes a plurality of first pits provided in the first surface. Widths of the first pits are 200 nm or more. A density in the first surface of the first pits is not less than $5 \times 10^7/cm^2$ and not more than $1 \times 10^8/cm^2$.

17 Claims, 8 Drawing Sheets

(51) Int. Cl.
  *H01L 29/06* (2006.01)
  *C23C 16/44* (2006.01)
  *H01L 21/02* (2006.01)
  *C23C 16/30* (2006.01)
  *H01L 29/778* (2006.01)

(52) U.S. Cl.
  CPC .... *H01L 21/0254* (2013.01); *H01L 21/02458* (2013.01); *H01L 29/0657* (2013.01); *H01L 29/205* (2013.01); *H01L 29/7786* (2013.01)

(56) References Cited

U.S. PATENT DOCUMENTS

| | | |
|---|---|---|
| 2018/0166855 A1 | 6/2018 | Takeuchi et al. |
| 2018/0174824 A1 | 6/2018 | Matsuda |
| 2021/0234008 A1* | 7/2021 | Nago .................. H01L 21/0254 |

FOREIGN PATENT DOCUMENTS

| | | |
|---|---|---|
| JP | 2016-225578 A | 12/2016 |
| JP | 2018-98347 A | 6/2018 |
| JP | 2018-101701 A | 6/2018 |

OTHER PUBLICATIONS

Miyoshi et al., "Epitaxial growth and characterization of approximately 300-nm-thick AlInN films nearly lattice-matched to c-plane GaN grown on sapphire", Applied Physics Express 11, 051001 (2018), https://doi.org/10.7567/APEX.11.051001, 5 pages.

Kuramoto et al., "High-output-power and high-temperature operation of blue GaN-based vertical-cavity surface-emitting laser", Applied Physics Express 11, 112101 (2018), https://doi.org/10.7567/APEX.11.112101, 4 pages.

Yamada et al., "Electron mobility enhancement in metalorganic-vapor-phase-epitaxy-grown InAlN high-electron-mobility transistors by control of surface morphology of spacer layer", Japanese Journal of Applied Physics 57, 01AD01, https://doi.org/10.7567/JJAP.57.01AD01, 2017, 8 pages.

* cited by examiner

FIG. 9
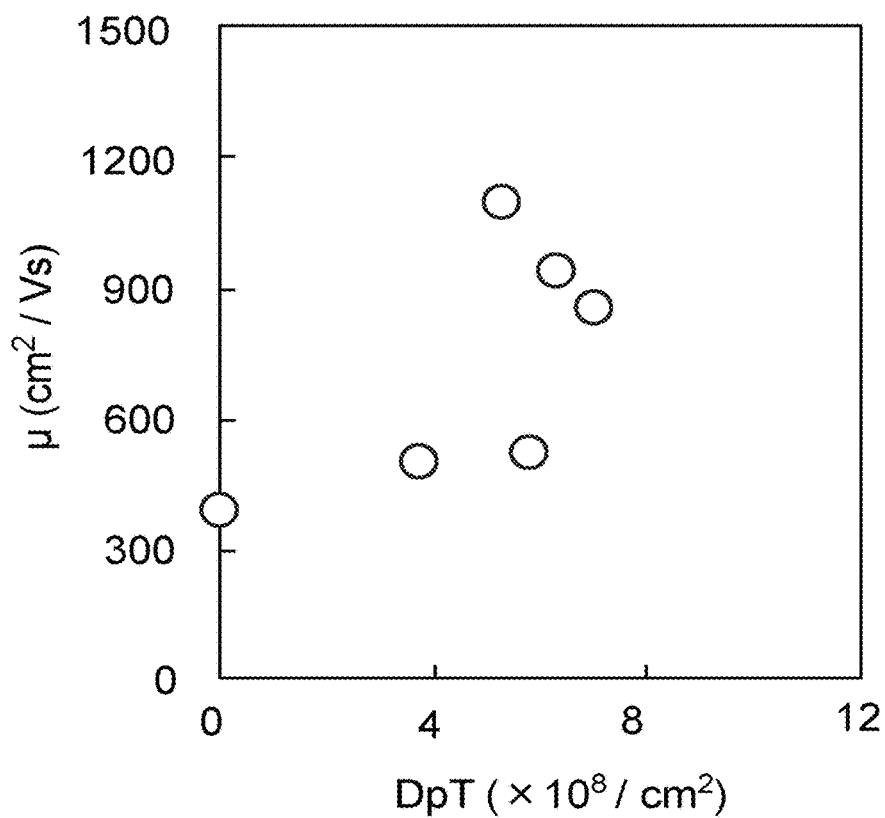
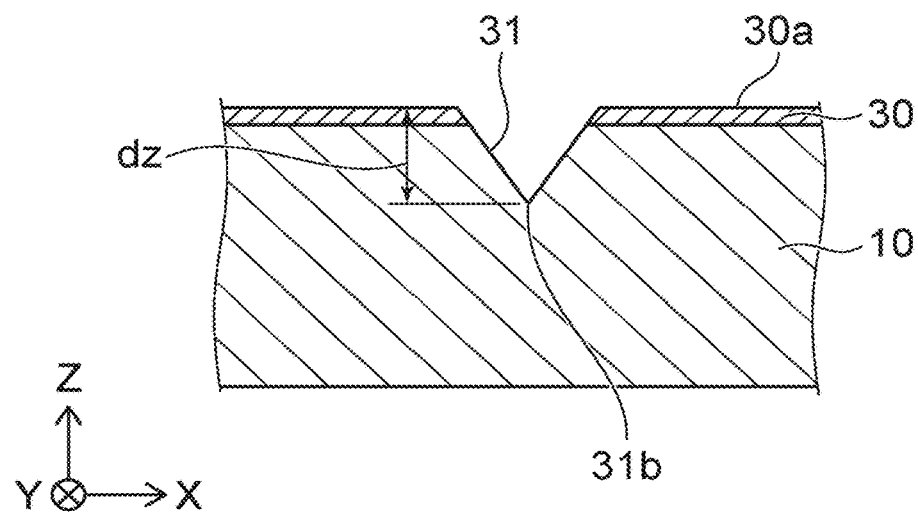
FIG. 10

SEMICONDUCTOR DEVICE, METHOD FOR MANUFACTURING SEMICONDUCTOR DEVICE, AND MANUFACTURING APPARATUS OF SEMICONDUCTOR DEVICE

CROSS-REFERENCE TO RELATED APPLICATIONS

This application is based upon and claims the benefit of priority from Japanese Patent Application No. 2020-010742 filed on Jan. 27, 2020; the entire contents of which are incorporated herein by reference.

FIELD

Embodiments of the invention generally relate to a semiconductor device, a method for manufacturing a semiconductor device, and a manufacturing apparatus of a semiconductor device.

BACKGROUND

For example, it is desirable to improve the characteristics of a semiconductor device such as a transistor or the like.

BRIEF DESCRIPTION OF THE DRAWINGS

FIG. 9 is a graph illustrating a characteristic of the semiconductor device;

FIG. 10 is a schematic cross-sectional view illustrating the semiconductor device;

DETAILED DESCRIPTION

Figure 1:
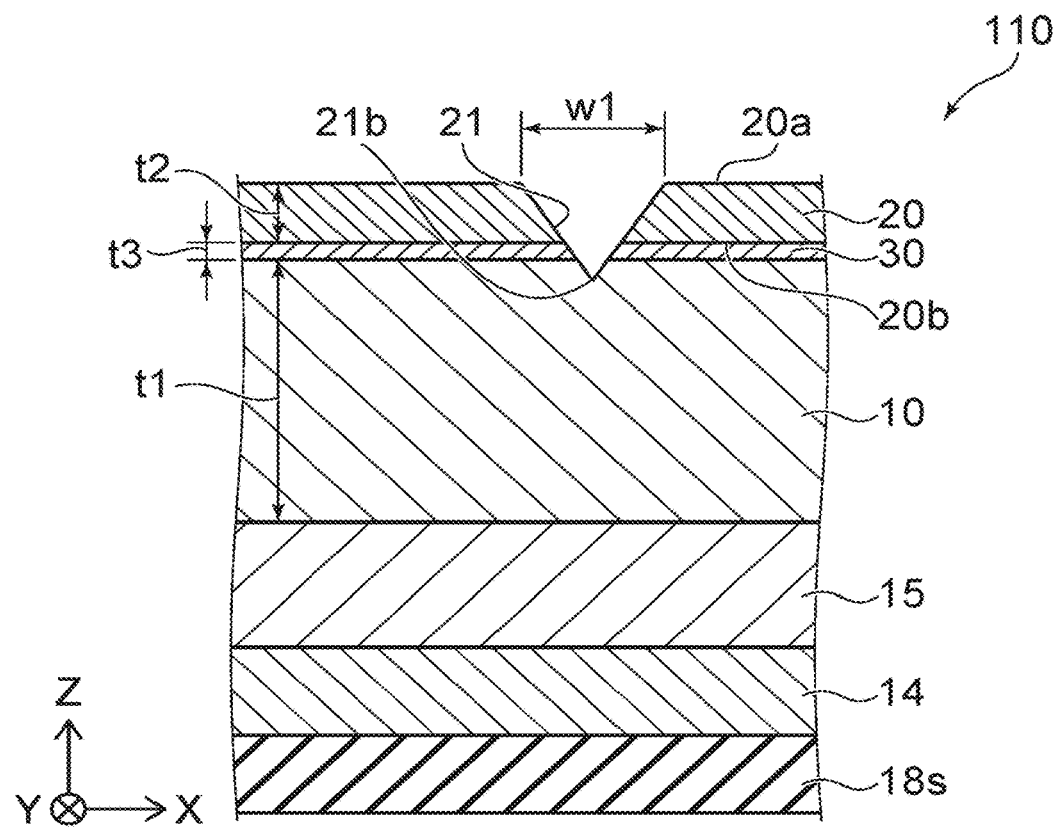
FIG. 1 is a schematic cross-sectional view illustrating a semiconductor device according to a first embodiment.

According to one embodiment, a semiconductor device includes a first semiconductor layer including $Al_{x1}Ga_{1-x1}N$ (0≤x1<1), a second semiconductor layer including $Al_{x2}In_{1-x2}N$ (0<x2<1 and x1<x2), and an intermediate region provided between the first semiconductor layer and the second semiconductor layer. The intermediate region includes $Al_{x3}Ga_{1-x3}N$ (0<x3≤1 and x2<x3). The second semiconductor layer includes a first surface and a second surface. The second surface is between the intermediate region and the first surface in a first direction. The first direction is from the first semiconductor layer toward the second semiconductor layer. The second semiconductor layer includes a plurality of first pits provided in the first surface. Widths of the first pits are 200 nm or more. A density in the first surface of the first pits is not less than $5×10^7/cm^2$ and not more than $1×10^8/cm^2$.

According to one embodiment, a method for manufacturing a semiconductor device is disclosed. The method can include forming an intermediate region including $Al_{x3}Ga_{1-x3}N$ (0<x3≤1 and x2<x3) on a first semiconductor layer including $Al_{x1}Ga_{1-x1}N$ (0≤x1<1), and forming a second semiconductor layer including $Al_{x2}In_{1-x2}N$ (0<x2<1 and x1<x2) on the intermediate region. A first gas is used to form the intermediate region in the forming of the intermediate region. The first gas includes a gas including Al, a gas including ammonia, and a gas including hydrogen. A second gas is used to form the second semiconductor layer in the forming of the second semiconductor layer. The second gas includes a gas including Al, a gas including In, a gas including ammonia, and a gas including nitrogen.

According to one embodiment, a manufacturing apparatus of a semiconductor device includes a processing chamber, and a stage configured to have a processing body provided in the processing chamber and placed on the stage. The processing chamber includes a first inlet and a second inlet. The first inlet is configured to introduce at least one of a first gas or a second gas. The first gas includes Al, ammonia, and hydrogen. The second gas includes Al, In, ammonia, and nitrogen. The second inlet is configured to introduce a third gas including chlorine.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with the same reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first semiconductor layer 10, a second semiconductor layer 20, and an intermediate region 30. A substrate 18s, a fourth semiconductor layer 14, and a fifth semiconductor layer 15 are provided in the example. The substrate 18s, the fourth semiconductor layer 14, and the fifth semiconductor layer 15 may be included in the semiconductor device 110.

The first semiconductor layer 10 includes $Al_{x1}Ga_{1-x1}N$ (0≤x1<1). The first semiconductor layer 10 includes, for example, GaN. The Al composition ratio in the first semiconductor layer 10 is, for example, not less than 0 and not more than 0.05.

The second semiconductor layer 20 includes $Al_{x2}In_{1-x2}N$ (0≤<x2<1 and x1<x2). The second semiconductor layer 20 includes AlInN. The Al composition ratio in the second semiconductor layer 20 is, for example, greater than 0.05 and not more than 0.4.

The intermediate region 30 is provided between the first semiconductor layer 10 and the second semiconductor layer 20. The intermediate region 30 includes $Al_{x3}Ga_{1-x3}N$ ($0<x3\leq1$ and $x2<x3$). The intermediate region 30 includes, for example, AlN. The Al composition ratio in the intermediate region 30 is, for example, 0.5 or more.

For example, the intermediate region 30 is between the substrate 18s and the second semiconductor layer 20. The first semiconductor layer 10 is between the substrate 18s and the intermediate region 30. The substrate 18s includes, for example, silicon. In one example, the substrate 18s is a silicon substrate.

The fourth semiconductor layer 14 includes AlN. The fifth semiconductor layer 15 includes AlGaN. The fifth semiconductor layer 15 is between the substrate 18s and the first semiconductor layer 10. The fourth semiconductor layer 14 is between the substrate 18s and the fifth semiconductor layer 15.

For example, the fourth semiconductor layer 14 is provided on the substrate 18s. The fifth semiconductor layer 15 is provided on the fourth semiconductor layer 14. The first semiconductor layer 10 is provided on the fifth semiconductor layer 15. The intermediate region 30 is provided on the first semiconductor layer 10. The second semiconductor layer 20 is provided on the intermediate region 30.

For example, a carrier region (e.g., a two-dimensional electron gas) is formed in a portion of the first semiconductor layer 10 at the second semiconductor layer 20 side. High mobility is obtained by using such a semiconductor layer. The semiconductor device 110 is, for example, a HEMT (High Electron Mobility Transistor).

The direction from the first semiconductor layer 10 toward the second semiconductor layer 20 is taken as a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

The first semiconductor layer 10 and the second semiconductor layer 20 have layer configurations spreading along the X-Y plane.

As shown in FIG. 1, the second semiconductor layer 20 includes a first surface 20a and a second surface 20b. The second surface 20b is between the intermediate region 30 and the first surface 20a in the first direction (the Z-axis direction) from the first semiconductor layer 10 toward the second semiconductor layer 20. The first surface 20a is, for example, the upper surface. The second surface 20b is the lower surface.

As shown in FIG. 1, the second semiconductor layer 20 includes a first pit 21. The first pit 21 is provided in the first surface 20a. Multiple first pits 21 are provided in the first surface 20a. One of the multiple first pits 21 is illustrated in FIG. 1.

The widths (first widths w1) of the multiple first pits 21 are 200 nm or more. The first width w1 corresponds to the length of the first pit 21 along one direction crossing the first direction (the Z-axis direction). As described below, pits that have widths that are 200 nm or less may be provided in the first surface 20a. Among the multiple pits provided in the first surface 20a, the pits that have widths that are 200 nm or more correspond to the first pits 21. For example, the minimum value of the widths of the multiple first pits 21 is 200 nm.

As shown in FIG. 1, the width of the opening of the first pit 21 may change along the Z-axis direction. The first width w1 corresponds to the opening width at the top of the first surface 20a.

The intermediate region 30 is provided in the embodiment. For example, high mobility is obtained thereby. A semiconductor device can be provided in which the characteristics can be improved.

Examples of pits of the semiconductor device will now be described.

Figure 2:
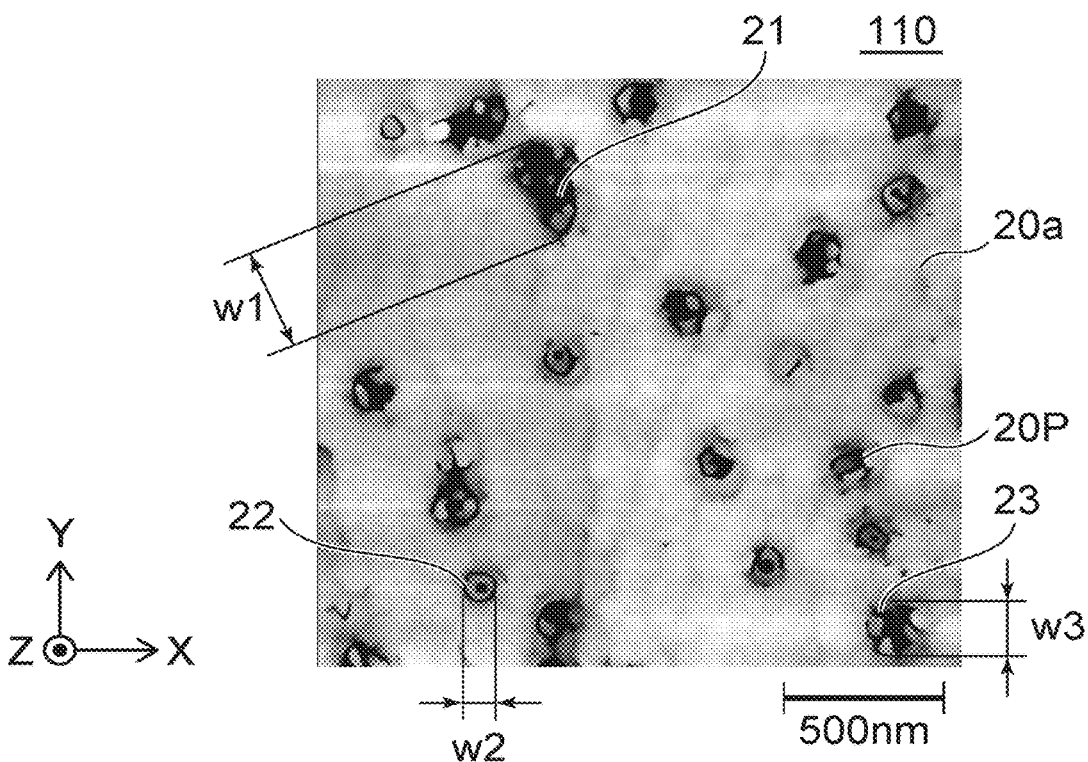
FIG. 2 is a schematic cross-sectional view illustrating the semiconductor device.
Figure 3:
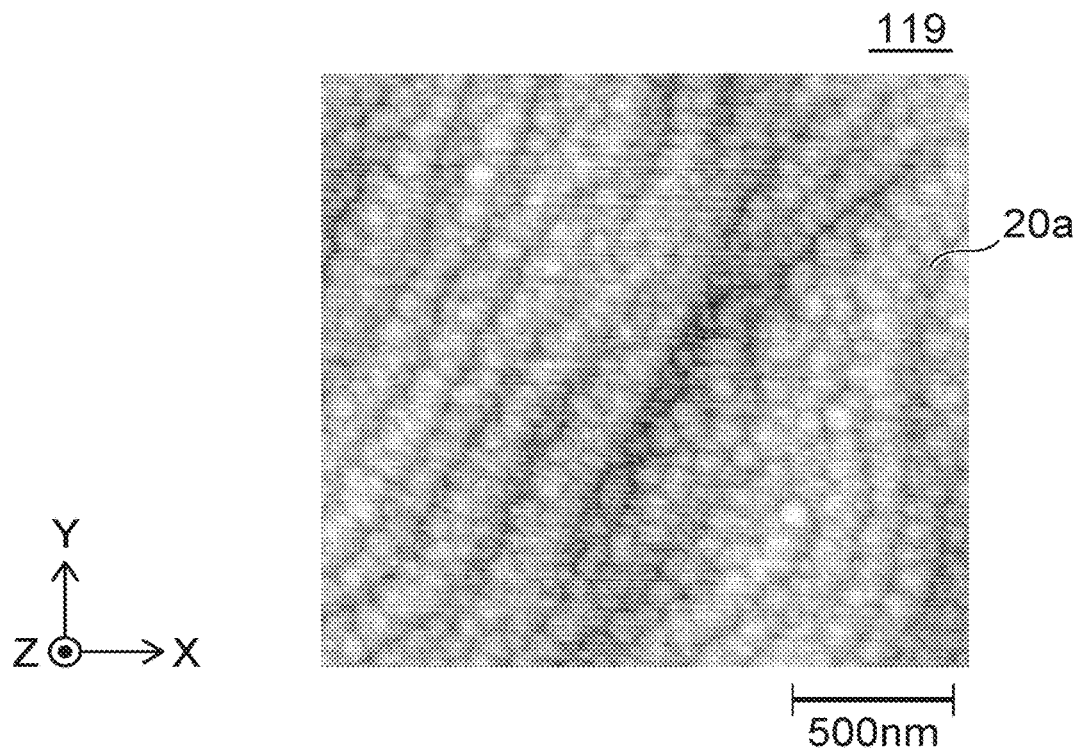
FIG. 3 is a schematic cross-section& view illustrating a semiconductor device.

FIGS. 2 and 3 are schematic cross-sectional views illustrating semiconductor devices.

FIGS. 2 and 3 are AFM images of the surface (the first surface 20a) of the second semiconductor layer 20. FIG. 2 corresponds to the semiconductor device 110. FIG. 3 corresponds to a semiconductor device 119 of a reference example. As described above, the intermediate region 30 (e.g., AlN) is provided between the first semiconductor layer 10 and the second semiconductor layer 20 in the semiconductor device 110. In the semiconductor device 119, the intermediate region 30 is not provided, and the second semiconductor layer 20 contacts the first semiconductor layer 10.

As shown in FIG. 2, multiple pits 20P are in the first surface 20a in the semiconductor device 110. At least one of the multiple pits 20P corresponds to the first pit 21. As shown in FIG. 2, a portion of the multiple pits 20P may include pits (a second pit 22 or the like described below) that have narrow widths.

As shown in FIG. 3, none of the multiple pits 20P are in the first surface 20a in the semiconductor device 119 of the reference example.

Characteristics of the semiconductor device 110 and the semiconductor device 119 were measured. In the semiconductor device 110, the mobility was 1179 $cm^2/Vs$. In the semiconductor device 119, the mobility was 392 $cm^2/Vs$. Thus, it was found that high mobility was obtained in the semiconductor device 110 that includes pits.

For example, in a configuration in which the first semiconductor layer 10 of GaN or the like and the second semiconductor layer 20 of AlInN are combined, the a-axis lattice length of the second semiconductor layer 20 can be caused to match the a-axis lattice length of the first semiconductor layer 10 by adjusting the Al composition ratio in the second semiconductor layer 20. Thereby, the strain of the semiconductor layer can be 0 or small. Thereby, for example, compared to when there is lattice strain, the spontaneous polarization effect is increased. For example, compared to when there is lattice strain, the barrier effect can be increased. A high-concentration carrier region (two-dimensional electron gas) is obtained thereby.

However, it was found that the mobility is low when the intermediate region 30 is not provided as in the semiconductor device 119 of the reference example described above. It is considered that this is because the In concentration fluctuation unfavorably affects the characteristics. For example, the concentration of In easily becomes nonuniform in a nitride semiconductor including In. In particular, the nonuniformity of the In concentration becomes large when the growth temperature of the second semiconductor layer 20 is low. It is considered that the high In concentration in the second semiconductor layer 20 diffuses into the first semiconductor layer 10 and locally causes the carrier region to disappear. Thereby, in the semiconductor device 119, it is difficult to obtain high mobility.

In the embodiment, the intermediate region 30 is provided between the first semiconductor layer 10 and the second semiconductor layer 20. It is considered that the unfavorable effects of In such as those described above are suppressed thereby. It is considered that high mobility is obtained by providing the intermediate region 30.

In the semiconductor device 110, the first semiconductor layer 10 includes GaN, the second semiconductor layer 20 includes AlInN, and the intermediate region 30 includes AlN. It is considered that the local disappearance of the carrier region can be more effectively suppressed because the effects of the In concentration do not occur easily when the intermediate region 30 includes AlN. In the embodiment, for example, the In composition ratio in the second semiconductor layer 20 is not less than 0.15 and not more than 0.2. For example, the In composition ratio in the second semiconductor layer 20 may be not less than 0.17 and not more than 0.18. The lattice lengths are better matched.

A thickness t3 along the first direction (the Z-axis direction) of the intermediate region 30 (referring to FIG. 1) is not less than 0.5 nm and not more than 1.5 nm. A thickness t2 along the first direction of the second semiconductor layer 20 (referring to FIG. 1) is, for example, not less than 3 nm and not more than 20 nm. A thickness t1 along the first direction of the first semiconductor layer 10 is, for example, not less than 1 μm and not more than 3 μm.

In the configuration of the semiconductor device 110, high mobility is obtained by providing an appropriate concentration of the first pits 21 having widths that are 200 nm or more. Examples of the widths (the sizes) of the pits 20P will now be described.

Figure 4:
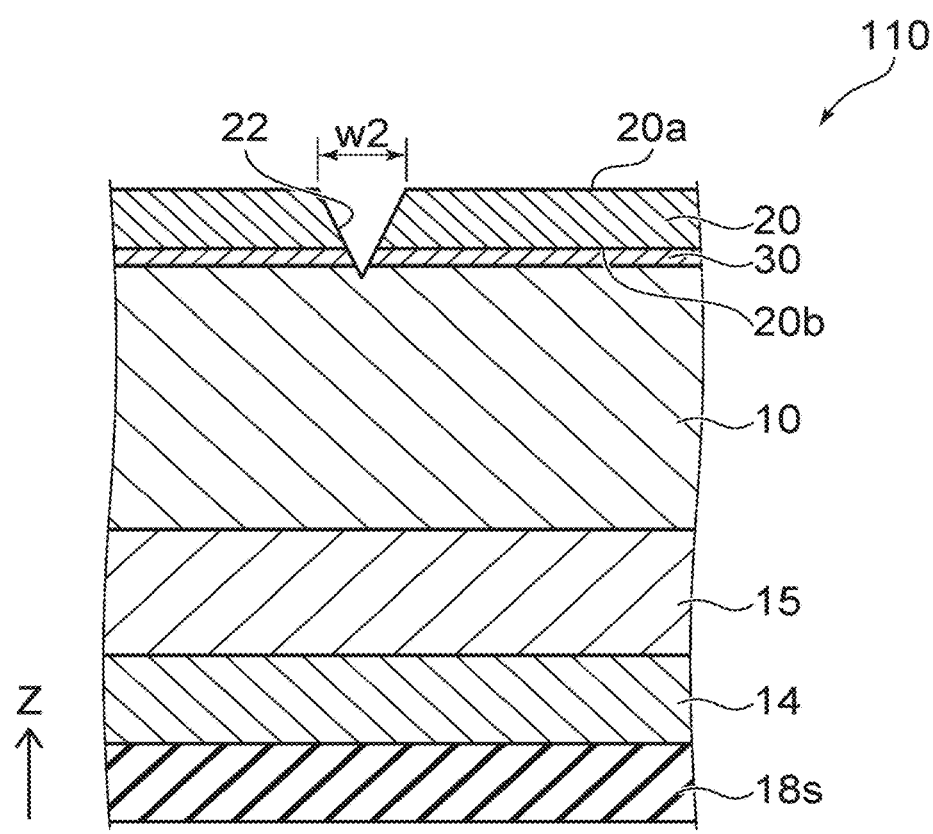
FIG. 4 is a schematic cross-sectional view illustrating the semiconductor device according to the first embodiment.
Figure 5:
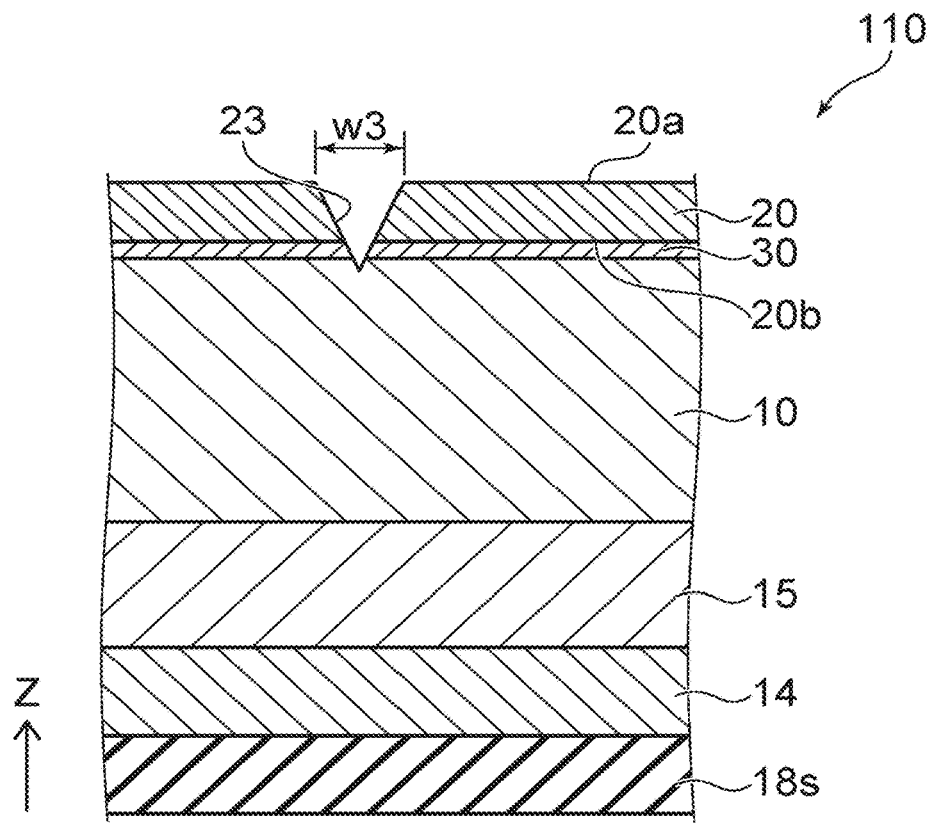
FIG. 5 is a schematic cross-sectional view illustrating the semiconductor device according to the first embodiment.

FIGS. 4 and 5 are schematic cross-sectional views illustrating the semiconductor device according to the first embodiment.

As shown in FIGS. 1 and 2, the widths (the first widths w1) of the multiple first pits 21 are 200 nm or more. The first width w1 corresponds to the maximum value of the length along the X-Y plane of the first pit 21.

As shown in FIG. 2, the pits 20P that have narrow widths also exist in the first surface 20a. The pits 20P include, for example, the multiple second pits 22. The pits 20P may include, for example, multiple third pits 23.

As shown in FIG. 4, the second semiconductor layer 20 includes the multiple second pits 22 that are provided in the first surface 20a. The widths (second widths w2) of the multiple second pits 22 are not less than 60 nm and not more than 120 nm. The second width w2 corresponds to the length (the maximum value) of the second pit 22 along one direction crossing the first direction (the Z-axis direction).

As shown in FIGS. 2 and 5, the second semiconductor layer 20 may include the multiple third pits 23 provided in the first surface 20a. The widths (third widths w3) of the multiple third pits 23 are not less than 60 nm but less than 200 nm. The third width w3 corresponds to the length (the maximum value) of the third pit 23 along one direction crossing the first direction (the Z-axis direction). A portion of the multiple third pits 23 corresponds to the multiple second pits 22.

Figure 6:
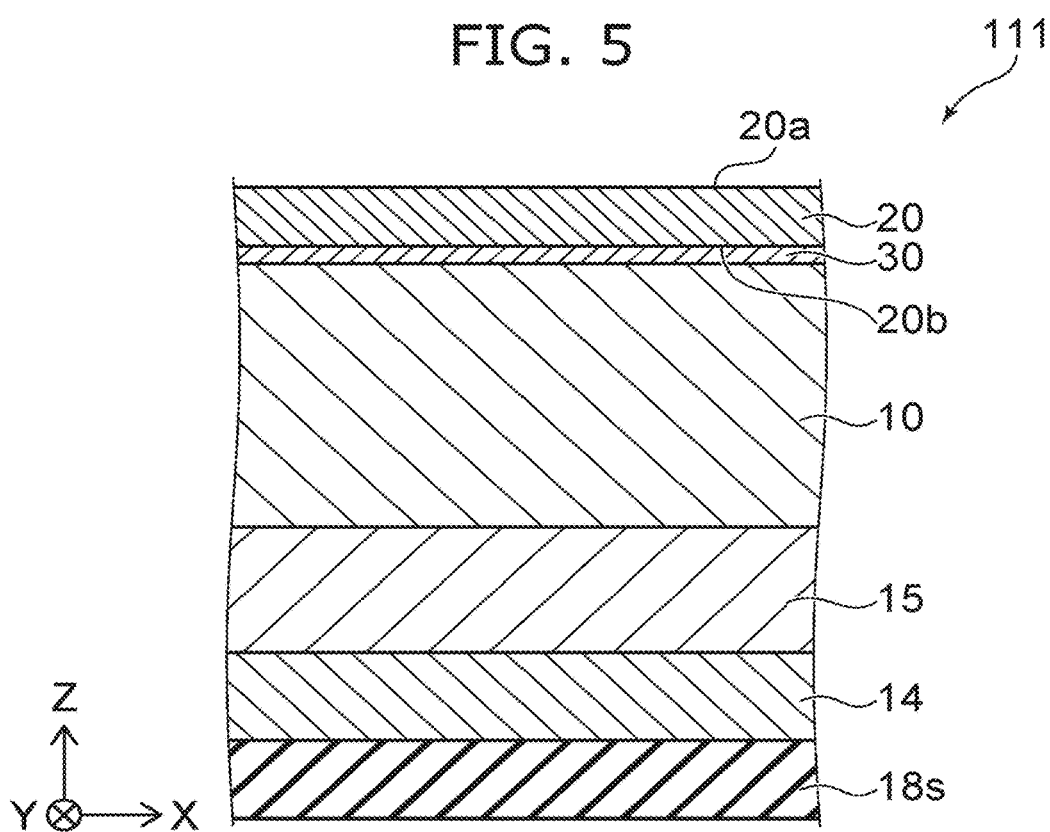
FIG. 6 is a schematic cross-sectional view illustrating a sample of a semiconductor device.

FIG. 6 is a schematic cross-sectional view illustrating a sample of the semiconductor device.

In the sample 111 as shown in FIG. 6, a stacked film of Ti/Al/Ni/Au was provided as an electrode. The mobility and the like were evaluated thereby. The formation conditions of the sample 111 were modified. The pits 20P occurred with various widths and densities.

Figure 7:
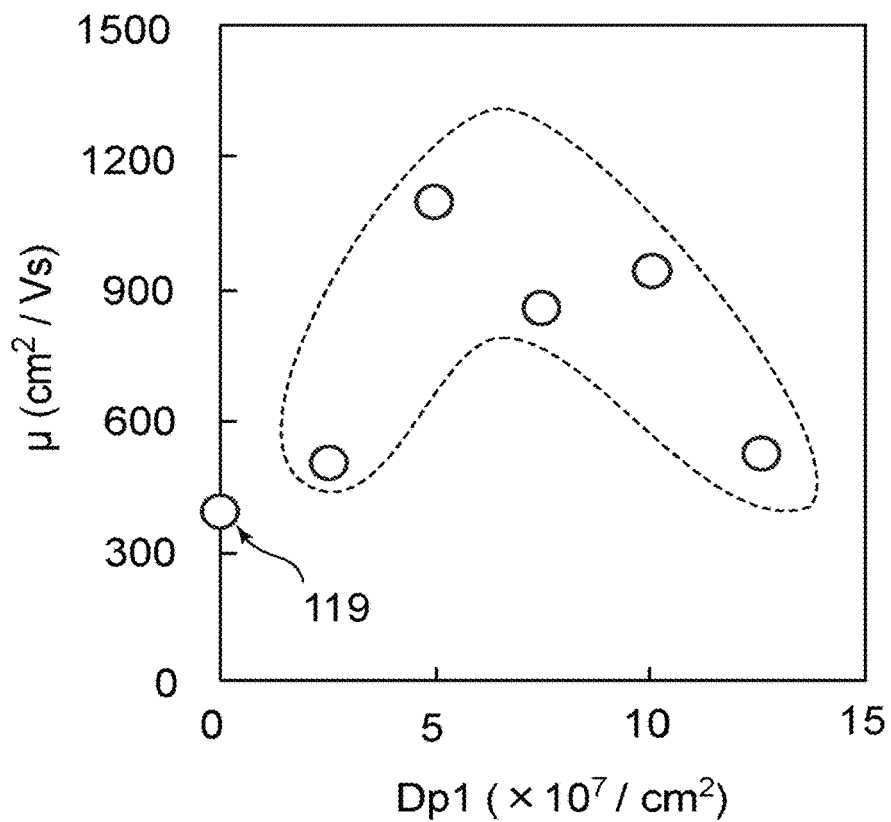
FIG. 7 is a graph illustrating characteristics of the semiconductor devices.

FIG. 7 is a graph illustrating characteristics of the semiconductor devices.

FIG. 7 illustrates evaluation results of a characteristic of the sample 111 described above. FIG. 7 also illustrates a characteristic of the semiconductor device 119 of the reference example described above. The horizontal axis of FIG. 7 is a density Dp1 of the first pits 21 of which the widths are 200 nm or more. The vertical axis is a mobility μ.

As shown in FIG. 7, the density Dp1 of the first pits 21 is substantially 0 for the semiconductor device 119 of the reference example. The mobility μ is low for the semiconductor device 119.

As shown in FIG. 7, a high mobility is obtained when the density Dp1 is not less than $5\times10^7/cm^2$ and not more than $1\times10^8/cm^2$ for the sample 111.

When the density Dp1 is excessively low, it is considered that defects are introduced to the intermediate region 30 as stress accumulates due to the lattice matching difference between the first semiconductor layer 10 and the intermediate region 30. It is considered that when the density Dp1 is excessively high, the accumulation of forces is avoided, but the introduction of an impurity, the diffusion of the components of the second semiconductor layer 20, etc., occur. In the embodiment, it is favorable for the density Dp1 to be not less than $5\times10^7/cm^2$ and not more than $1\times10^8/cm^2$. A high mobility μ is obtained thereby.

By providing the first pits 21 with a moderate density and relatively wide widths, it is possible to form the intermediate region 30 in which appropriate crystallinity is maintained. It is considered that a good interface with the carrier region of the first semiconductor layer 10 can be formed thereby.

Figure 8:
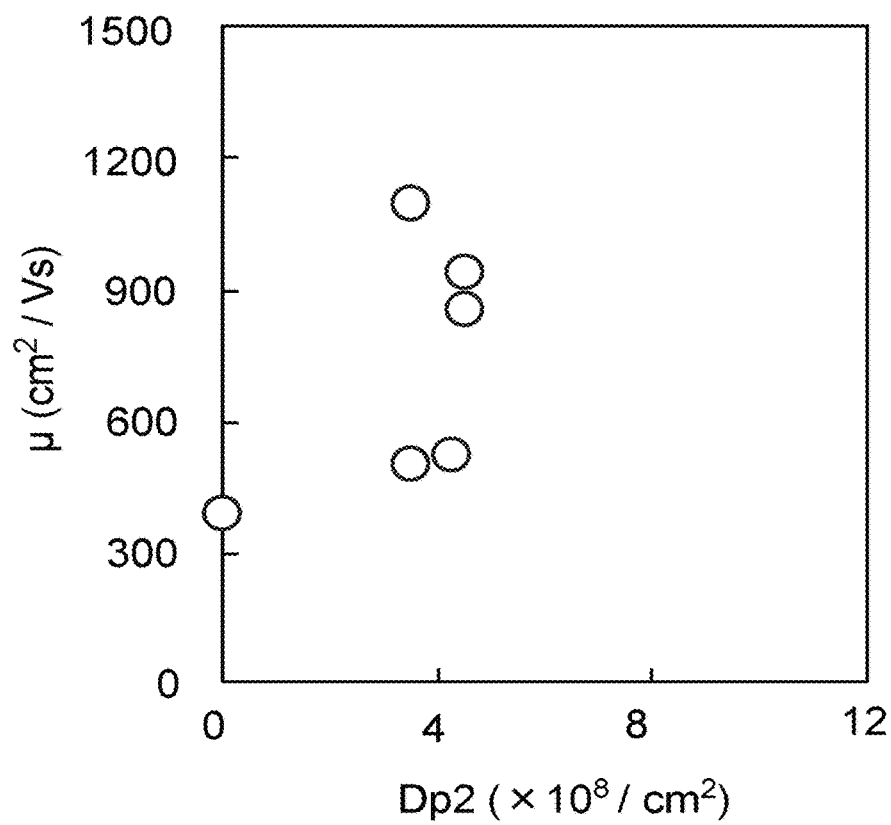
FIG. 8 is a graph illustrating a characteristic of the semiconductor device.

FIG. 8 is a graph illustrating a characteristic of the semiconductor device.

FIG. 8 illustrates evaluation results of a characteristic of the sample 111 described above. The horizontal axis of FIG. 8 is a density Dp2 of the second pits 22 of which the widths are 200 nm or less. The vertical axis is the mobility As shown in FIG. 8, even when changing the density Dp2 of the second pits 22 which are narrow, a correlation with the mobility μ is not seen.

FIG. 9 is a graph illustrating a characteristic of the semiconductor device.

FIG. 9 illustrates evaluation results of a characteristic of the sample 111 described above. The horizontal axis of FIG. 9 is a density DpT for the total of the third pits 23, of which the widths are not less than 80 nm but less than 200 nm, and the first pits 21, of which the widths are 200 nm or more. The vertical axis is the mobility μ.

As shown in FIG. 9, the mobility μ does not change much, even when the density DpT of the pits 20P of various widths is changed.

It can be seen from FIGS. 7 to 9 that the density Dp1 of the first pits 21, of which the widths are 200 nm or more, has a strong relationship with the mobility μ.

In the embodiment, it is favorable for the density Dp1 in the first surface 20a of the multiple first pits 21, of which the widths are 200 nm or more, to be not less than $5\times10^7/cm^2$ and not more than $1\times10^8/cm^2$. In the embodiment, the density in the first surface 20a of the multiple third pits 23, of which the widths are not less than 80 nm but less than 200 nm, is not less than $5\times10^7/cm^2$ and not more than $5\times10^8/cm^2$. For example, the density in the first surface 20a of the multiple second pits 22, of which the widths are not less than 60 nm and not more than 120 nm, is not less than $1\times10^8/cm^2$ and not more than $5\times10^8/cm^2$.

In the embodiment, for example, the widths (the first widths w1) of the multiple first pits 21 are 300 nm or less. When the width is excessively large, for example, an impurity (e.g., C or the like) is easily introduced. When the width is excessively large, for example, the characteristics easily degrade due to diffusion of elements included in the second semiconductor layer 20, etc.

In the embodiment as shown in FIG. 1, a bottom 21b of at least one of the multiple first pits 21 is in the first semiconductor layer 10.

In the embodiment, for example, the intermediate region 30 may have an island configuration or a mesh configuration. It is considered that the diffusion (e.g., the diffusion of In, etc.) from the second semiconductor layer 20 into the first semiconductor layer 10 can be suppressed even when the intermediate region 30 does not have a perfect film configuration.

FIG. 10 is a schematic cross-sectional view illustrating the semiconductor device.

FIG. 10 illustrates the state of the intermediate region 30 before the second semiconductor layer 20 is formed. As shown in FIG. 10, a pit 31 exists in an upper surface 30a of the intermediate region 30. A bottom 31b of the pit 31 is in the first semiconductor layer 10. The pit 31 is formed when growing the first semiconductor layer 10. The pit 31 also remains after the intermediate region 30 is formed. The second semiconductor layer 20 is formed on the intermediate region 30 that includes such a pit 31. The pit 20P that occurs in the first surface 20a of the second semiconductor layer 20 has the pit 31 as a starting point.

The depth along the first direction (the Z-axis direction) of the pit 31 is taken as a depth dz. Examples of the depth dz will now be described.

Figure 11:
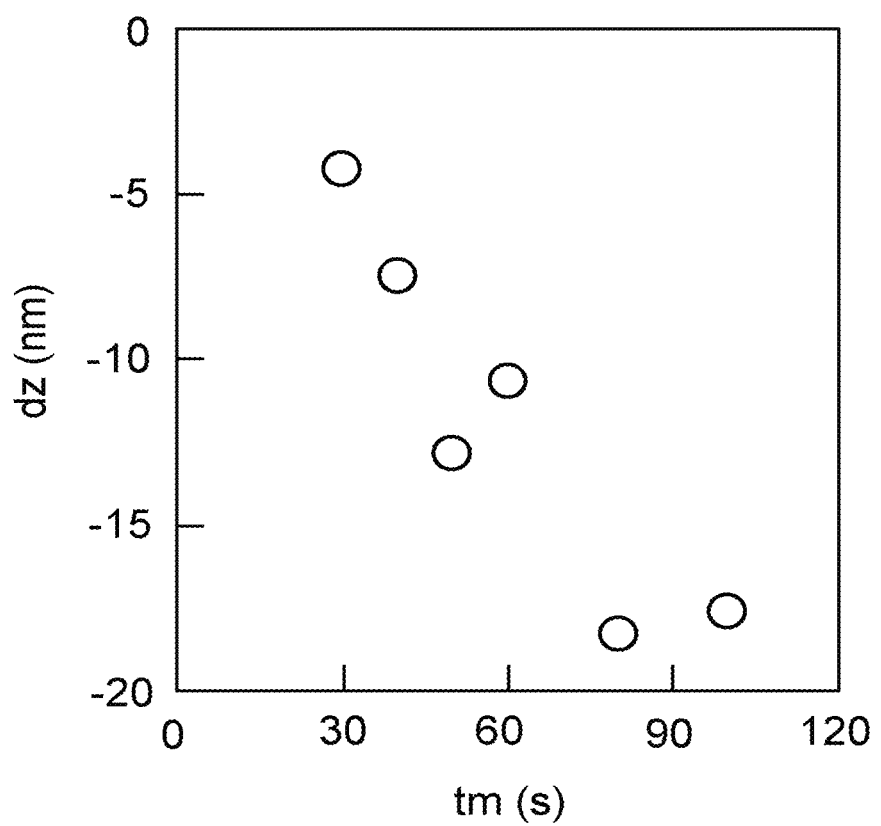
FIG. 11 is a graph illustrating a characteristic of the semiconductor device.

FIG. 11 is a graph illustrating a characteristic of the semiconductor device.

The horizontal axis of FIG. 11 is a processing time tm for forming the intermediate region 30. The vertical axis is the depth dz of the pit 31. The depth dz of the pit 31 is the distance referenced to the upper surface 30a of the intermediate region 30. The thickness t3 of the intermediate region 30 increases as the processing time tm increases.

As shown in FIG. 11, the depth dz increases as the processing time tm increases. Therefore, it is considered that the bottom portion and the side surface of the pit 31 are removed in the formation of the intermediate region 30. It is considered that the formation of the film used to form the intermediate region 30 and the etching of the sidewall of the pit 31 simultaneously progress.

For example, it is considered that when the depth dz is deep, the width of the pit 20P in the second semiconductor layer 20 formed on the intermediate region 30 can be increased. For example, the width of the pit 20P in the second semiconductor layer 20 can be increased by lengthening the processing time of the formation of the intermediate region 30.

Figure 12:
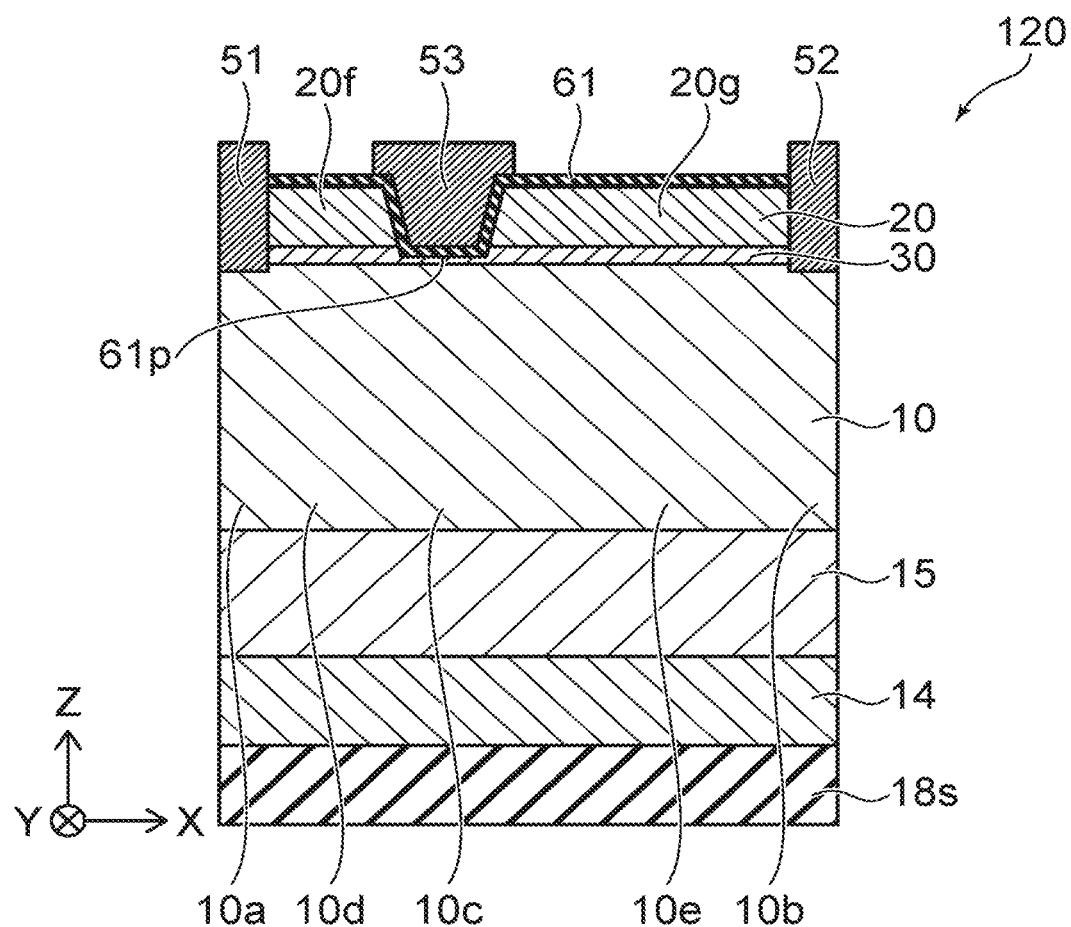
FIG. 12 is a schematic cross-sectional view illustrating a semiconductor device according to the embodiment.

FIG. 12 is a schematic cross-sectional view illustrating a semiconductor device according to the embodiment.

As shown in FIG. 12, the semiconductor device 120 according to the embodiment includes a first electrode 51, a second electrode 52, a third electrode 53, and an insulating member 61 in addition to the first semiconductor layer 10, the second semiconductor layer 20, and the intermediate region 30. The configurations of the first semiconductor layer 10, the second semiconductor layer 20, and the intermediate region 30 of the semiconductor device 120 may be similar to the configurations of the first semiconductor layer 10, the second semiconductor layer 20, and the intermediate region 30 of the semiconductor device 110. Examples of the first electrode 51, the second electrode 52, the third electrode 53, and the insulating member 61 will now be described.

The direction from the first electrode 51 toward the second electrode 52 is along a second direction crossing the first direction (the Z-axis direction). The second direction is, for example, the X-axis direction. The position in the second direction of the third electrode 53 is between the position in the second direction of the first electrode 51 and the position in the second direction of the second electrode 52.

The first semiconductor layer 10 includes a first partial region 10a, a second partial region 10b, a third partial region 10c, a fourth partial region 10d, and a fifth partial region 10e. The direction from the first partial region 10a toward the first electrode 51 is along the first direction (the Z-axis direction). The direction from the second partial region 10b toward the second electrode 52 is along the first direction. The third partial region 10c is between the first partial region 10a and the second partial region 10b in the second direction (e.g., the X-axis direction). The direction from the third partial region 10c toward the third electrode 53 is along the first direction (the Z-axis direction).

The fourth partial region 10d is between the first partial region 10a and the third partial region 10c in the second direction (the X-axis direction). The fifth partial region 10e is between the third partial region 10c and the second partial region 10b in the second direction.

The second semiconductor layer 20 includes a sixth partial region 20f and a seventh partial region 20g. The direction from the fourth partial region 10d toward the sixth partial region 20f is along the first direction (the Z-axis direction). The direction from the fifth partial region 10e toward the seventh partial region 20g is along the first direction.

The insulating member 61 includes a first insulating region 61p. The first insulating region 61p is provided between the third partial region 10c and the third electrode 53 in the first direction (the Z-axis direction).

For example, the first electrode 51 functions as a source electrode. For example, the second electrode 52 functions as a drain electrode. For example, the third electrode 53 functions as a gate electrode. For example, the first insulating region 61p functions as a gate insulating film.

High mobility is obtained in the semiconductor device 120.

Second Embodiment

Figure 13:
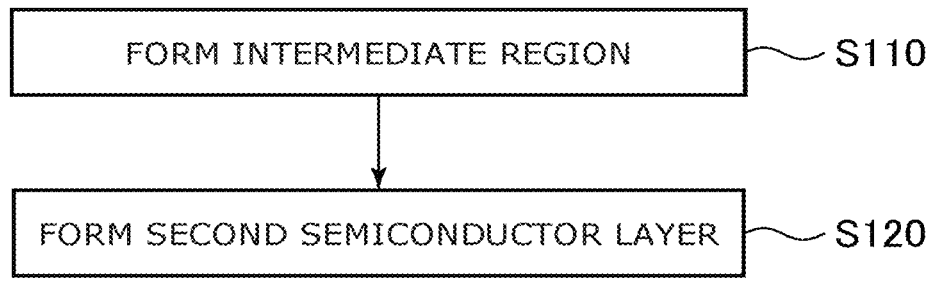
FIG. 13 is a flowchart illustrating a method for manufacturing a semiconductor device according to a second embodiment.

FIG. 13 is a flowchart illustrating a method for manufacturing a semiconductor device according to a second embodiment.

As shown in FIG. 13, the intermediate region 30 that includes $Al_{x3}Ga_{1-x3}N$ ($0<x3\leq1$ and $x2<x3$) is formed on the first semiconductor layer 10 that includes $Al_{x1}Ga_{1-x1}N$ ($0\leq x1<1$) (step S110).

The second semiconductor layer 20 that includes $Al_{x2}In_{1-x2}N$ ($0<x2<1$ and $x1<x2$) is formed on the intermediate region 30 (step S120).

The formation of the intermediate region 30 includes forming the intermediate region 30 by using a first gas including a gas including Al, a gas including ammonia, and a gas including hydrogen. The formation of the second semiconductor layer 20 includes forming the second semiconductor layer 20 by using a second gas including a gas including Al, a gas including In, a gas including ammonia, and a gas including nitrogen.

Thus, the first gas that includes hydrogen is used to form the intermediate region 30. The hydrogen is, for example, a carrier gas. By using such a first gas, a deep pit 31 is obtained with an appropriate width.

The second gas that includes nitrogen is used to form the second semiconductor layer 20. The nitrogen is, for example, a carrier gas. By using such a second gas, the second semiconductor layer 20 that includes the multiple first pits 21 such as those described above is efficiently obtained.

Third Embodiment

Figure 14:
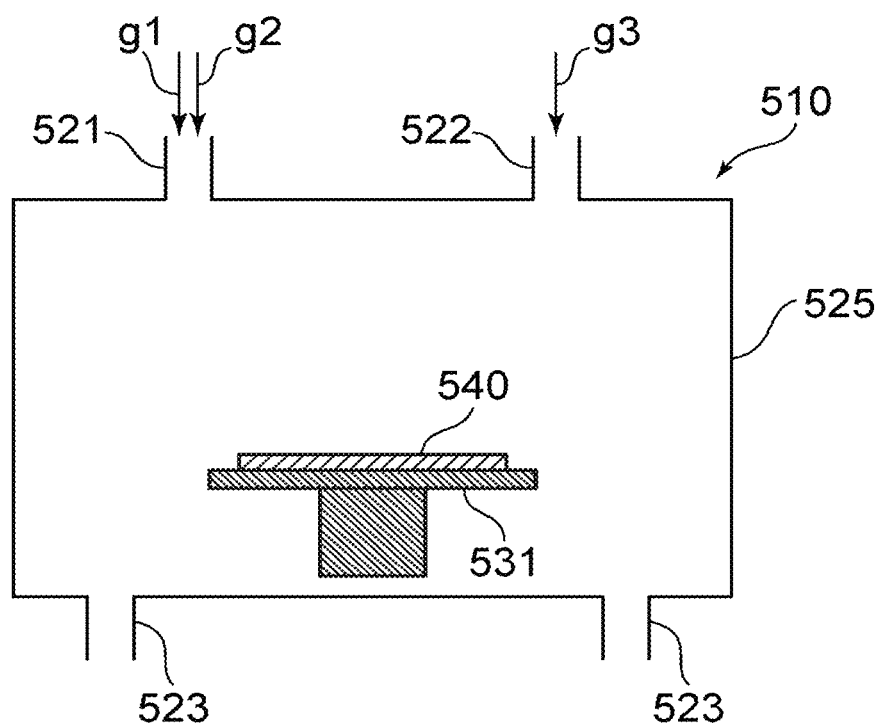
FIG. 14 is a schematic cross-sectional view illustrating a manufacturing apparatus of a semiconductor device according to a third embodiment.

FIG. 14 is a schematic cross-sectional view illustrating a manufacturing apparatus of a semiconductor device according to a third embodiment. As shown in FIG. 14, the manufacturing apparatus 510 of the semiconductor device according to the third embodiment includes a processing chamber 525 and a stage 531. The stage 531 is provided in the processing chamber 525. A processing body (a wafer) can be placed on the stage 531.

The processing chamber 525 includes a first inlet 521 and a second inlet 522. The first inlet 521 is configured to introduce at least one of a first gas g1 or a second gas g2. The first gas g1 includes Al, ammonia, and hydrogen. The second gas includes Al, In, ammonia, and nitrogen. For example, the first gas g1 is used to form the intermediate region 30. The second gas g2 is used to form the second semiconductor layer 20.

The second inlet 522 is configured to introduce a third gas g3. The third gas g3 includes chlorine. For example, the third gas g3 is used to clean the processing chamber 525. By providing the second inlet 522 for the third gas g3 and by cleaning the processing chamber 525 as necessary, unnecessary residual elements can be effectively removed.

As shown in FIG. 14, a drain 523 is provided in the processing chamber 525. The gases are exhausted through the drain 523.

The embodiments may include the following configurations (e.g., technological proposals).
Configuration 1
A semiconductor device, comprising:
a first semiconductor layer including $Al_{x1}Ga_{1-x1}N$ ($0 \leq x1 < 1$);
a second semiconductor layer including $Al_{x2}In_{1-x2}N$ ($0 < x2 < 1$ and $x1 < x2$); and
an intermediate region provided between the first semiconductor layer and the second semiconductor layer, the intermediate region including $Al_{x3}Ga_{1-x3}N$ ($0 < x3 \leq 1$ and $x2 < x3$),
the second semiconductor layer including a first surface and a second surface,
the second surface being between the intermediate region and the first surface in a first direction, the first direction being from the first semiconductor layer toward the second semiconductor layer,
the second semiconductor layer including a plurality of first pits provided in the first surface,
widths of the plurality of first pits being 200 nm or more,
a density in the first surface of the plurality of first pits being not less than $5 \times 10^7/cm^2$ and not more than $1 \times 10^8/cm^2$.
Configuration 2
The semiconductor device according to Configuration 1, wherein
the second semiconductor layer includes a plurality of second pits provided in the first surface,
widths of the plurality of second pits are not less than 60 nm and not more than 120 nm, and
a density in the first surface of the plurality of second pits is not less than $1 \times 10^8/cm^2$ and not more than $5 \times 10^8/cm^2$.
Configuration 3
The semiconductor device according to Configuration 1, wherein
the second semiconductor layer includes a plurality of third pits provided in the first surface,
widths of the plurality of third pits are not less than 80 nm but less than 200 nm, and
a density in the first surface of the plurality of third pits is not less than $5 \times 10^7/cm^2$ and not more than $5 \times 10^8/cm^2$.
Configuration 4
The semiconductor device according to any one of Configurations 1 to 3, wherein
the first semiconductor layer includes GaN,
the second semiconductor layer includes AlInN, and
the intermediate region includes AlN.
Configuration 5
The semiconductor device according to Configuration 4, wherein
a composition ratio of In in the second semiconductor layer is not less than 0.15 and not more than 0.2.
Configuration 6
The semiconductor device according to any one of Configurations 1 to 5, wherein
a thickness along the first direction of the intermediate region is not less than 0.5 nm and not more than 1.5 nm.
Configuration 7
The semiconductor device according to any one of Configurations 1 to 6, wherein
a thickness along the first direction of the second semiconductor layer is not less than 3 nm and not more than 20 nm.
Configuration 8
The semiconductor device according to any one of Configurations 1 to 7, wherein
a thickness along the first direction of the first semiconductor layer is not less than 1 μm and not more than 3 μm.
Configuration 9
The semiconductor device according to any one of Configurations 1 to 8, further comprising:
a substrate,
the intermediate region being between the substrate and the second semiconductor layer,
the first semiconductor layer being between the substrate and the intermediate region.
Configuration 10
The semiconductor device according to Configuration 9, wherein
the substrate includes silicon.
Configuration 11
The semiconductor device according to Configuration 9 or 10, further comprising:
a fourth semiconductor layer including AlN; and
a fifth semiconductor layer including AlGaN,
the fifth semiconductor layer being between the substrate and the first semiconductor layer,
the fourth semiconductor layer being between the substrate and the fifth semiconductor layer.
Configuration 12
The semiconductor device according to any one of Configurations 1 to 11, wherein
the widths of the plurality of first pits are 300 nm or less.
Configuration 13
The semiconductor device according to any one of Configurations 1 to 12, wherein
a bottom of at least one of the plurality of first pits is in the first semiconductor layer.

Configuration 14

The semiconductor device according to any one of Configurations 1 to 13, wherein
at least one of the plurality of first pits has a pit in the first semiconductor layer as a starting point.

Configuration 15

The semiconductor device according to any one of Configurations 1 to 14, wherein
the intermediate region has an island configuration or a mesh configuration.

Configuration 16

The semiconductor device according to Configuration 4, wherein
a composition ratio of In in the second semiconductor layer is not less than 0.17 and not more than 0.18.

Configuration 17

The semiconductor device according to any one of Configurations 1 to 16, further comprising:
a first electrode;
a second electrode;
a third electrode; and
an insulating member,
a direction from the first electrode toward the second electrode being along a second direction crossing the first direction,
a position in the second direction of the third electrode being between a position in the second direction of the first electrode and a position in the second direction of the second electrode,
the first semiconductor layer including a first partial region, a second partial region, a third partial region, a fourth partial region, and a fifth partial region,
a direction from the first partial region toward the first electrode being along the first direction,
a direction from the second partial region toward the second electrode being along the first direction,
the third partial region being between the first partial region and the second partial region in the second direction,
a direction from the third partial region toward the third electrode being along the first direction,
the fourth partial region being between the first partial region and the third partial region in the second direction,
the fifth partial region being between the third partial region and the second partial region in the second direction,
the second semiconductor layer including a sixth partial region and a seventh partial region,
a direction from the fourth partial region toward the sixth partial region being along the first direction,
a direction from the fifth partial region toward the seventh partial region being along the first direction,
the insulating member including a first insulating region provided between the third partial region and the third electrode in the first direction.

Configuration 18

A method for manufacturing a semiconductor device, the method comprising:
forming an intermediate region including $Al_{x3}Ga_{1-x3}N$ ($0<x3\leq1$ and $x2<x3$) on a first semiconductor layer including $Al_{x1}Ga_{1-x1}N$ ($0\leq x1<1$); and
forming a second semiconductor layer including $Al_{x2}In_{1-x2}N$ ($0<x2<1$ and $x1<x2$) on the intermediate region,
a first gas being used to form the intermediate region in the forming of the intermediate region, the first gas including a gas including Al, a gas including ammonia, and a gas including hydrogen,
a second gas being used to form the second semiconductor layer in the forming of the second semiconductor layer, the second gas including a gas including Al, a gas including In, a gas including ammonia, and a gas including nitrogen.

Configuration 19

The method for manufacturing the semiconductor device according to Configuration 18, wherein
the second semiconductor layer includes a plurality of first pits,
widths of the plurality of first pits are 200 nm or more, and
a density of the plurality of first pits is not less than $5\times10^7/cm^2$ and not more than $1\times10^8/cm^2$.

Configuration 20

A manufacturing apparatus of a semiconductor device, comprising:
a processing chamber; and
a stage configured to have a processing body provided in the processing chamber and placed on the stage,
the processing chamber including
a first inlet configured to introduce at least one of a first gas or a second gas, the first gas including Al, ammonia, and hydrogen, the second gas including Al, In, ammonia, and nitrogen, and
a second inlet configured to introduce a third gas including chlorine.

According to the embodiments, a semiconductor device, a method for manufacturing a semiconductor device, and a manufacturing apparatus of a semiconductor device can be provided in which the characteristics can be improved.

In the embodiments, "nitride semiconductor" includes all compositions of semiconductors of the chemical formula $B_xIn_yAl_zGa_{1-x-y-z}N$ ($0\leq x\leq1$, $0\leq y\leq1$, $0\leq z\leq1$, and $x+y+z\leq1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, intermediate regions, electrodes, insulating members, etc., from known art. Such practice is included in the scope of the invention to the extent that similar effects thereto are obtained. Further, any two or more components of the specific examples may be combined within the extent of technical feasibility and are included in the scope of the invention to the extent that the purport of the invention is included.

Moreover, all semiconductor devices, methods for manufacturing semiconductor devices, and manufacturing apparatuses of semiconductor devices practicable by an appropriate design modification by one skilled in the art based on the semiconductor devices, the methods for semiconductor devices, and the manufacturing apparatuses of semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first semiconductor layer including $Al_{x1}Ga_{1-x1}N$ ($0 \leq x1 < 1$);
a second semiconductor layer including $Al_{x2}In_{1-x2}N$ ($0 < x2 < 1$ and $x1 < x2$); and
an intermediate region provided between the first semiconductor layer and the second semiconductor layer, the intermediate region including $Al_{x3}Ga_{1-x3}N$ ($0 < x3 \leq 1$ and $x2 < x3$),
the second semiconductor layer including a first surface and a second surface,
the second surface being between the intermediate region and the first surface in a first direction, the first direction being from the first semiconductor layer toward the second semiconductor layer,
the second semiconductor layer including a plurality of first pits provided in the first surface,
widths of the plurality of first pits being 200 nm or more,
a density in the first surface of the plurality of first pits being not less than $5 \times 10^7/cm^2$ and not more than $1 \times 10^8/cm^2$.

2. The device according to claim 1, wherein
the second semiconductor layer includes a plurality of second pits provided in the first surface,
widths of the plurality of second pits are not less than 60 nm and not more than 120 nm, and
a density in the first surface of the plurality of second pits is not less than $1 \times 10^8/cm^2$ and not more than $5 \times 10^8/cm^2$.

3. The device according to claim 1, wherein
the second semiconductor layer includes a plurality of third pits provided in the first surface,
widths of the plurality of third pits are not less than 80 nm but less than 200 nm, and
a density in the first surface of the plurality of third pits is not less than $5 \times 10^7/cm^2$ and not more than $5 \times 10^8/cm^2$.

4. The device according to claim 1, wherein
the first semiconductor layer includes GaN,
the second semiconductor layer includes AlInN, and
the intermediate region includes AlN.

5. The device according to claim 4, wherein
a composition ratio of In in the second semiconductor layer is not less than 0.15 and not more than 0.2.

6. The device according to claim 1, wherein
a thickness along the first direction of the intermediate region is not less than 0.5 nm and not more than 1.5 nm.

7. The device according to claim 1, wherein
a thickness along the first direction of the second semiconductor layer is not less than 3 nm and not more than 20 nm.

8. The device according to claim 1, wherein
a thickness along the first direction of the first semiconductor layer is not less than 1 μm and not more than 3 μm.

9. The device according to claim 1, further comprising:
a substrate,
the intermediate region being between the substrate and the second semiconductor layer,
the first semiconductor layer being between the substrate and the intermediate region.

10. The device according to claim 9, wherein
the substrate includes silicon.

11. The device according to claim 9, further comprising:
a fourth semiconductor layer including AlN; and
a fifth semiconductor layer including AlGaN,
the fifth semiconductor layer being between the substrate and the first semiconductor layer,
the fourth semiconductor layer being between the substrate and the fifth semiconductor layer.

12. The device according to claim 1, wherein
the widths of the plurality of first pits are 300 nm or less.

13. The device according to claim 1, wherein
a bottom of at least one of the plurality of first pits is in the first semiconductor layer.

14. The device according to claim 1, wherein
at least one of the plurality of first pits has a pit in the first semiconductor layer as a starting point.

15. The device according to claim 1, wherein
the intermediate region has an island configuration or a mesh configuration.

16. The device according to claim 4, wherein
a composition ratio of In in the second semiconductor layer is not less than 0.17 and not more than 0.18.

17. The device according to claim 1, further comprising:
a first electrode;
a second electrode;
a third electrode; and
an insulating member,
a direction from the first electrode toward the second electrode being along a second direction crossing the first direction,
a position in the second direction of the third electrode being between a position in the second direction of the first electrode and a position in the second direction of the second electrode,
the first semiconductor layer including a first partial region, a second partial region, a third partial region, a fourth partial region, and a fifth partial region,
a direction from the first partial region toward the first electrode being along the first direction,
a direction from the second partial region toward the second electrode being along the first direction,
the third partial region being between the first partial region and the second partial region in the second direction,
a direction from the third partial region toward the third electrode being along the first direction,
the fourth partial region being between the first partial region and the third partial region in the second direction,
the fifth partial region being between the third partial region and the second partial region in the second direction,
the second semiconductor layer including a sixth partial region and a seventh partial region,
a direction from the fourth partial region toward the sixth partial region being along the first direction,
a direction from the fifth partial region toward the seventh partial region being along the first direction,
the insulating member including a first insulating region provided between the third partial region and the third electrode in the first direction.

* * * * *